(12) United States Patent
Linnen et al.

(10) Patent No.: US 10,242,750 B2
(45) Date of Patent: Mar. 26, 2019

(54) HIGH-SPEED DATA PATH TESTING TECHNIQUES FOR NON-VOLATILE MEMORY

(71) Applicant: SANDISK TECHNOLOGIES LLC, Plano, TX (US)

(72) Inventors: Daniel Linnen, Naperville, IL (US); Srikar Peesari, San Jose, CA (US); Kirubakaran Periyannan, Santa Clara, CA (US); Shantanu Gupta, Milpitas, CA (US); Avinash Rajagiri, San Jose, CA (US); Dongxiang Liao, Sunnyvale, CA (US); Jagdish Sabde, Fremont, CA (US); Rajan Paudel, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/610,119

(22) Filed: May 31, 2017

(65) Prior Publication Data

US 2018/0350445 A1    Dec. 6, 2018

(51) Int. Cl.
*G11C 29/12* (2006.01)
*G11C 7/10* (2006.01)
*G11C 7/22* (2006.01)

(52) U.S. Cl.
CPC ............ *G11C 29/1201* (2013.01); *G11C 7/10* (2013.01); *G11C 7/22* (2013.01)

(58) Field of Classification Search
CPC .................................... G11C 7/22; G11C 8/10
USPC ......................................... 365/189.05, 230.06
See application file for complete search history.

(56) References Cited

U.S. PATENT DOCUMENTS

| 6,463,560 | B1 * | 10/2002 | Bhawmik | G01R 31/3187 |
| | | | | 714/733 |
| 6,728,910 | B1 * | 4/2004 | Huang | G11C 29/16 |
| | | | | 365/200 |
| 6,735,709 | B1 * | 5/2004 | Lee | G01R 31/31937 |
| | | | | 702/89 |
| 7,054,790 | B1 * | 5/2006 | Rich | G06F 11/3419 |
| | | | | 360/78.06 |
| 8,902,661 | B1 * | 12/2014 | Raghu | G11C 16/10 |
| | | | | 365/185.05 |
| 2003/0065998 | A1 * | 4/2003 | Rios-Baez | G11C 29/40 |
| | | | | 714/718 |
| 2004/0003330 | A1 * | 1/2004 | Block | G01R 31/318552 |
| | | | | 714/726 |
| 2004/0015314 | A1 * | 1/2004 | Mayer | G11C 29/56 |
| | | | | 702/117 |

(Continued)

*Primary Examiner* — Michael T Tran
(74) *Attorney, Agent, or Firm* — Vierra Magen Marcus LLP

(57) ABSTRACT

Techniques are presented for testing the high-speed data path between the IO pads and the read/write buffer of a memory circuit without the use of an external test device. In an on-chip process, a data test pattern is transferred at a high data rate between the read/write register and a source for the test pattern, such as register for this purpose or the read/write buffer of another plane. The test data after the high-speed transfer is then checked against its expected, uncorrupted value, such as by transferring it back at a lower speed for comparison or by transferring the test data a second time, but at a lower rate, and comparing the high transfer rate copy with the lower transfer rate copy at the receiving end of the transfers.

19 Claims, 12 Drawing Sheets

(56) References Cited

U.S. PATENT DOCUMENTS

| | | | |
|---|---|---|---|
| 2004/0102916 A1* | 5/2004 | Chen | G06F 11/2284 702/117 |
| 2004/0153920 A1* | 8/2004 | Holmes | G01R 31/31813 714/724 |
| 2005/0047556 A1* | 3/2005 | Somerville | H04M 3/323 379/9.01 |
| 2006/0253752 A1* | 11/2006 | Krishnan | G01R 31/31715 714/724 |
| 2007/0140024 A1* | 6/2007 | Perry | G11C 29/40 365/201 |
| 2008/0235539 A1* | 9/2008 | Yamada | G01R 31/31813 714/703 |
| 2008/0235549 A1* | 9/2008 | Yamada | G01R 31/31813 714/738 |
| 2010/0128541 A1* | 5/2010 | Russell | G11C 5/147 365/189.011 |
| 2010/0153799 A1* | 6/2010 | Maroni | G06F 11/2733 714/735 |
| 2011/0004793 A1* | 1/2011 | Sul | G11C 29/003 714/718 |
| 2011/0153706 A1* | 6/2011 | Yancey | G06F 17/142 708/404 |
| 2011/0271155 A1* | 11/2011 | Tran | H04L 1/244 714/704 |
| 2012/0054547 A1* | 3/2012 | Nussbaum | G06F 11/27 714/32 |
| 2012/0324067 A1* | 12/2012 | Hari | G06F 13/385 709/222 |
| 2014/0157065 A1* | 6/2014 | Ong | G11C 29/12 714/718 |
| 2015/0131388 A1* | 5/2015 | Ware | G11C 5/04 365/189.02 |
| 2015/0206574 A1* | 7/2015 | Greathouse | G06F 13/1636 711/103 |
| 2015/0316605 A1* | 11/2015 | Deutsch | G01B 31/318547 702/117 |
| 2016/0071559 A1* | 3/2016 | Mitani | G11C 7/062 365/189.05 |
| 2016/0246608 A1* | 8/2016 | Newham | G06F 13/28 |
| 2016/0254035 A1* | 9/2016 | Dayley | G05F 3/08 365/189.05 |
| 2016/0284424 A1* | 9/2016 | Das | G11C 29/42 |
| 2016/0323435 A1* | 11/2016 | Antonopoulos | H04M 1/72527 |
| 2017/0116070 A1* | 4/2017 | Alrod | G06F 11/0793 |

* cited by examiner

HIGH-SPEED DATA PATH TESTING TECHNIQUES FOR NON-VOLATILE MEMORY

BACKGROUND

Semiconductor memory is widely used in various electronic devices, such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

In a memory circuit, data errors can occur in both the reading and the writing of data, as well as due to deterioration of the data stored in memory cells. Data errors can also occur during the transfer of data along the data paths between a memory die's input/output pads and the read/write circuitry for the cell arrays. As operation speeds increase on devices, these high-speed data paths can increasingly become a source of data errors. To maintain data integrity, it is important to minimize these various sources of error.

BRIEF DESCRIPTION OF THE DRAWINGS

Like-numbered elements refer to common components in the different figures.

DETAILED DESCRIPTION

An integrated memory circuit includes an array of memory cells along with associated reading and writing circuitry. Some non-volatile memory devices use a multi-plane structure, in which a memory die has multiple independently accessible arrays, or "planes," to increase storage density, improve efficiencies of operation, or both. To transfer data on and off of the memory die, the circuit has a number of input/output (IO) pads connected to a data bus, which is in turn connected to the read/write circuitry associated with the arrays. To improve performance, the circuitry can be operated at a higher speed. However, this can lead data errors occurring along the high-speed data path between the IO pads and the data buffers associated with the read/write circuitry that stores data read from, or to be written to, an array. To help minimize such errors along these high-speed data paths, it is important to test these paths for sources of error.

It can be difficult and expensive to externally verify the high-speed path of the individual dies through external testing using a probe. Testing at the package level, where multiple dies are combined into the package, can reduce the amount of testing and save cost, but can have a larger impact on yield as one defective die can result in the discarding of the entire multi-die package. As the trend is for more dies in each package and for these dies to operate at higher speeds, relying on package level testing can have a significant impact on product yield. To improve this situation, the following introduces on-chip test techniques for high-speed IO data path testing that can generate, transfer and compare data test patterns as part of a built-in self-test (BIST).

More specifically, the testing uses a high-speed transfer of a data test pattern over the bus structure that connects the IO pads to a buffer, that is used to store data read from, or to be written to, a memory array. The data test pattern after the transfer is then compared to its values prior to its transfer. For example, the data can be transferred from a register that supplies data test patterns or from the buffer of another plane over the bus at high speed and then compared with the same data test pattern transferred over the same bus, but at a lower data rate.

As the techniques described below relate to the data path between the IO pads and the buffers for the memory array, they are not specific to a particular memory cell array topology or memory cell technology. For example, the memory cells could be volatile DRAM, non-volatile EEPROM, or various other memory types. When reference is made to a particular memory structure for expository purposes, this will be taken as NAND flash memory.

Figure 1:
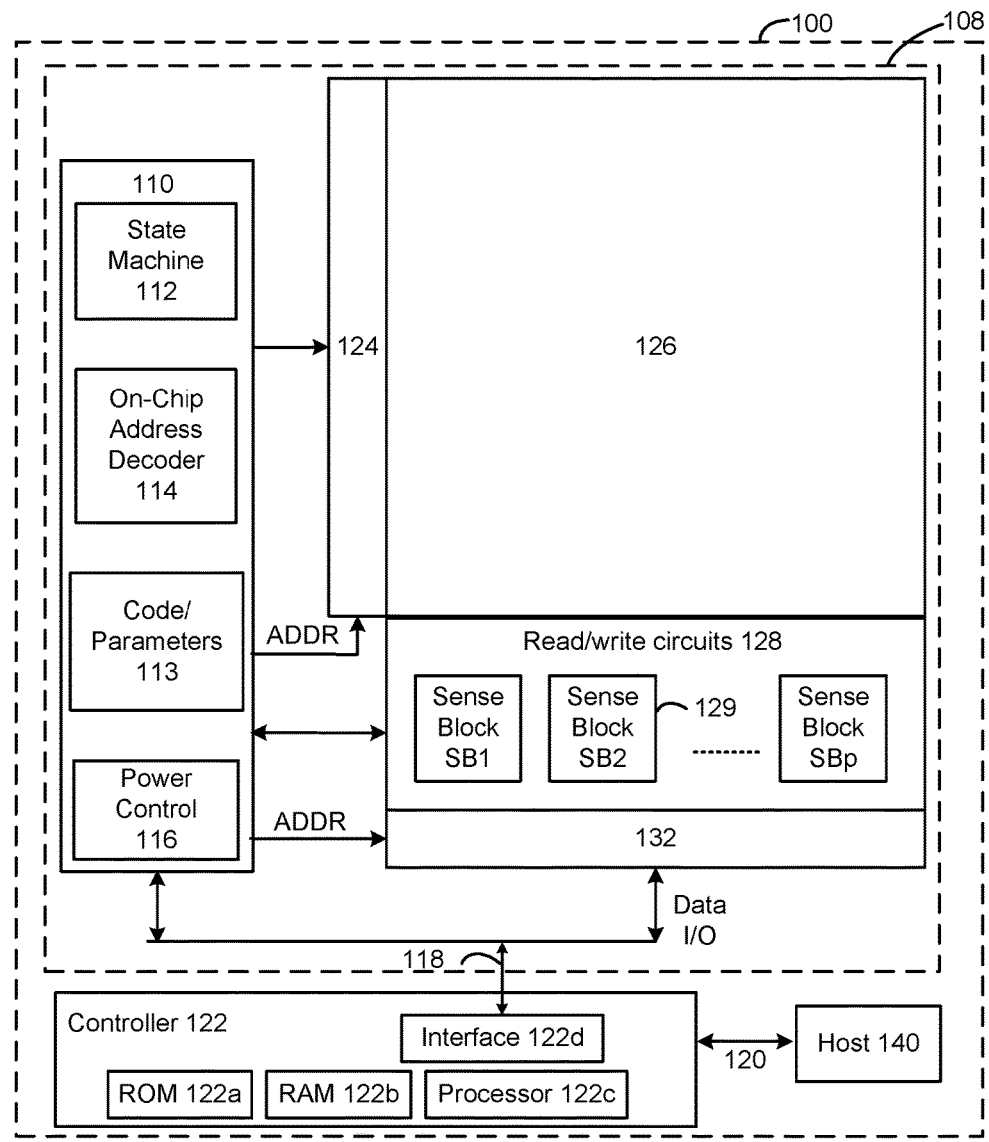
FIG. 1 is a functional block diagram of a memory device.

FIG. 1 is a functional block diagram of an example memory device. The components depicted in FIG. 1 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp 129 (sensing circuitry) and allow a page of memory cells to be read or programmed in parallel.

In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides memory die-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below, whether in a 3D or 2D configuration), select transistors (e.g., SGS and SGD transistors, described below) and source lines. In particular, the power control module can include the word line drivers that serve as the biasing circuitry for the word lines in the various memory operations described below. Power control module 116 may include charge pumps for creating voltages. The sense blocks include bit line drivers, including the bit line drivers that serve as the biasing circuitry for the bit lines in the various memory operations described below. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 may comprise a control circuit that performs the functions described herein.

The (on-chip or off-chip) controller 122 may comprise storage devices (such as ROM 122a and RAM 122b), a processor 122c and memory interface 122d. The storage devices store code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between controller 122 and memory die 108. For example, memory interface 122d can change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. A NAND flash memory array may be configured so that the array is composed of multiple NAND strings of which a NAND string is composed of multiple memory cells sharing a single bit line and accessed as a group. In one embodiment, NAND strings are grouped into blocks. Within a block, one end of each NAND string is connected to one of a plurality of bit lines and the other end of each NAND string is connected to a common source line for all (or a subset of) NAND strings in the block. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate of silicon or other material, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

The technology described herein can also be utilized with technologies in addition to the charge trapping and floating gate flash memory described above. In addition to flash memory (e.g., 2D and 3D NAND-type and NOR-type flash memory), examples of non-volatile memory include ReRAM memories, magnetoresistive memory (e.g., MRAM), and phase change memory (e.g., PCRAM).

One example of a ReRAM memory includes reversible resistance-switching elements arranged in cross point arrays accessed by X lines and Y lines (e.g., word lines and bit lines). Programming can be supplied by a series of voltage pulses (i.e. doses of programming) on the word lines. Memory cells can be inhibited by applying a large enough voltage on the corresponding bit lines to prevent a sufficient voltage differential across the memory cell.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Applying appropriate temperatures (over discrete periods of time—doses) can be used to program. Similarly, adjusting temperature can be used to inhibit. In some implementations, temperatures are controlled by applying voltages and/or currents to the memory cells and/or surrounding components.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created (i.e. the dose of programming). This approach requires a fairly substantial current to generate the field. Therefore, the programming is applied as a unit of current. Sufficiently reducing or removing the current can be used to inhibit programming.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that this technology is not limited to a single specific memory structure, but covers many relevant memory structures within the spirit and scope of the technology as described herein and as understood by one of ordinary skill in the art.

Figure 2:
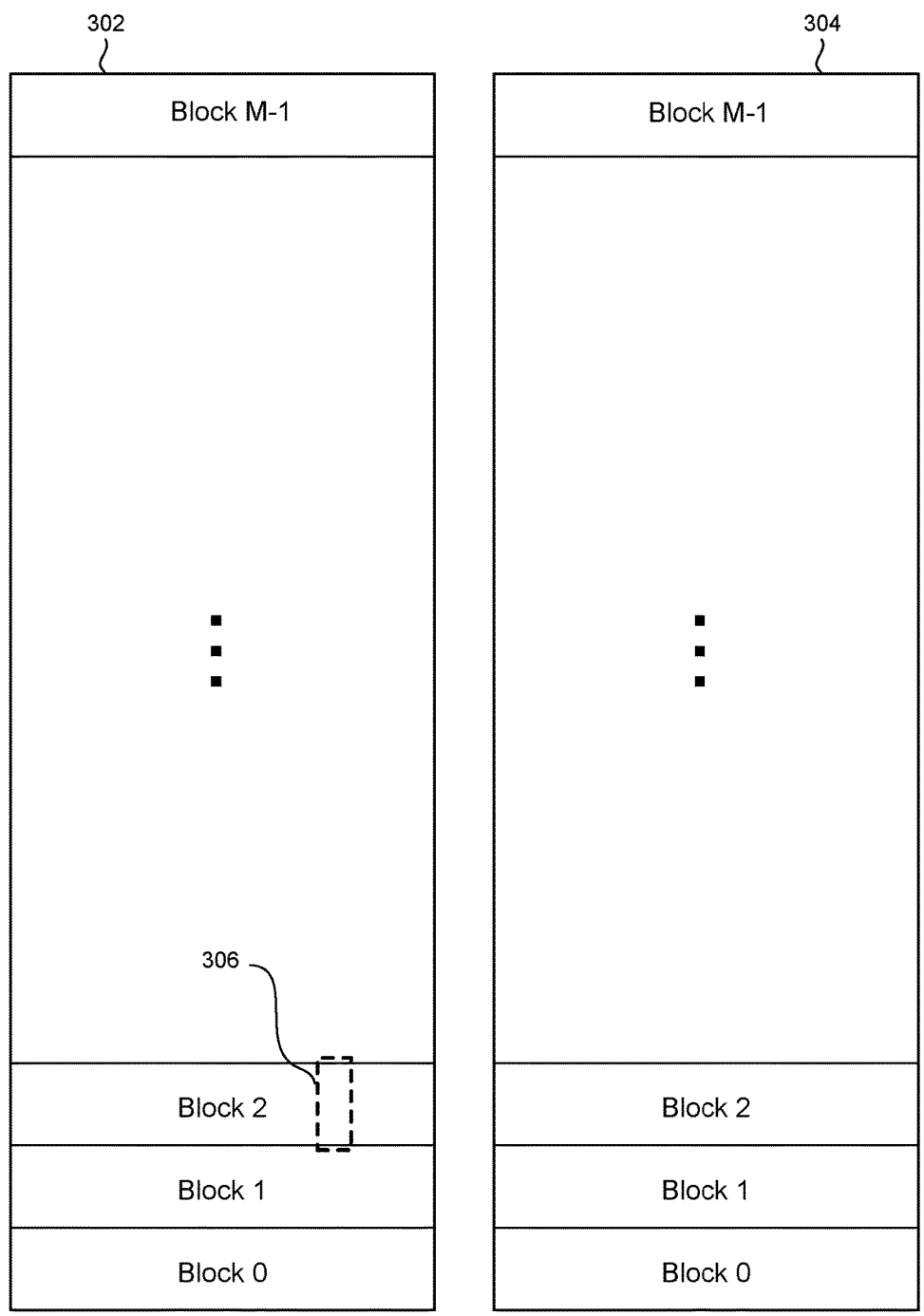
FIG. 2 is a block diagram of a memory structure having two planes.

A memory die can include one or more independently accessible arrays, or planes, of memory cells. FIG. 2 is a block diagram explaining one example organization of a memory structure, which is divided into two planes 302 and 304. Each plane is then divided into M blocks, such as block 306. In one example, each plane has about 2000 blocks. However, different numbers of blocks and planes can also be used.

Figure 3:
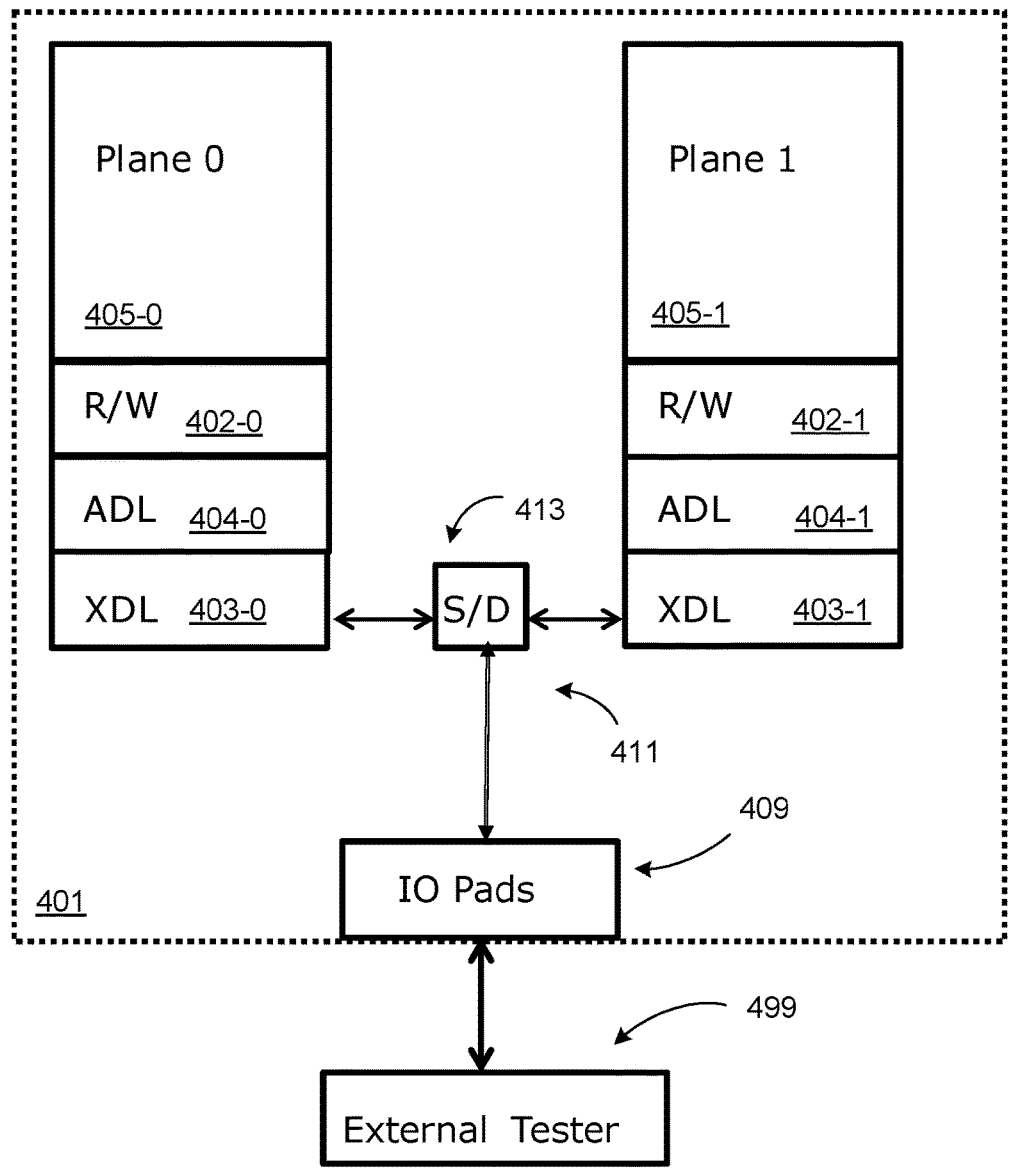
FIG. 3 illustrates elements of a dual plane memory circuit and testing of its data path by use of an external tester.

Returning now to the subject of the data path between the input/output (IO) pads and the data buffers associated with the read/write circuitry, FIG. 3 is a block diagram of a memory circuit 401, can be part of an example implementation of three dimensional memory structure 126. In this example, the memory circuit 401 includes two planes, Plane 0 405-0 and Plane 1 405-1, similar to discussed above with respect to FIG. 2. Although the discussion here is for an integrated circuit having two planes, it also applies to memory circuits of different numbers of planes. Each plane has corresponding read/write circuitry R/W 402-0 and 402-1 for plane 0 and plane 1 respectively. Each of the read/write circuits has one or more associated buffers to store data read from, or to be written to, the corresponding plane. Some of the data buffers associated with the read/write circuitry are explicitly shown. For each plane, the data buffers include a first XDL buffer (403-0, 403-1) having a set of external data latches, which are external in the sense that it connects to the data bus structure 411. The buffers associated with each plane can also include one or more additional sets of data latches, such as the ADL buffers (404-0, 404-1), whose latches can receive from or transfer data to the XDL buffer for the same plane. To store multiple pages of data at the same time, such as for use with multi-state data, the read/write buffers may include additional buffers (BDL, CDL, . . . ) for each plane beyond the shown XDL and ADL sets. The bus structure 411 also connects to the IO pads 409 of the memory die.

Where the bus structure 411 is connected to the IO pads 409, the bus may have one width (say, a byte wide for 8 IO pads) and have a wider width (such as several bytes wide) where it connects to the XDL buffer 403-0 for plane 0 and XDL buffer 403-1 of plane 1. For this purpose, the bus structure 411 can include serializer/deserializer circuits 413, as well as drivers or other elements not explicitly shown in FIG. 3. The bus structure 411 is the data path when data is transferred on to or of off the memory circuit 401. In a defective memory circuit, transferring data over all or part of this bus structure at high speeds can introduce error.

Traditionally, concerns about data error in memory circuits focus on the writing of data from the buffers to the array, deterioration of the data once written into the memory array, and the reading out of the data from the memory array. However, as the speeds at which data is transferred on memory circuits increases, the data paths on the memory die over which data is transferred can increasingly become a source of data error. Although the data bus structure and other elements in the data path may introduce little or no error at the lower, more traditional data rates used on such devices (of 400 MBPS, for example), the move to higher data rates (such as 800 MBPS or higher) can introduce transmission errors. For example, error due to the capacitances between the individual lines of the data bus or errors introduced in the serialization/deserialization process.

FIG. 3 also illustrates an external tester 499 that can be used to test the data path from the IO pads 409, over the bus structure 411, to the XDL buffer 403-0 for plane 0 or XDL buffer 403-1 for plane 1. It can be difficult and time consuming (and, consequently, expensive) to use an external tester to individually verify the high-speed data paths of the memory dies one by one. For example, attaching each of a memory die's IO pads to the probe contacts of the external tester 499 can itself be a source of error, even if the memory die itself is not defective. Once the memory dies are assembled into a multi-chip package, testing at the package level can be done more easily, and more quickly as the number of tests is reduced; but as the presence of a single bad memory die will result in the whole of the package being discarded, waiting to test until individual circuits are assembled into packages severely affects yields. Both the inclusion of more dies in each package and the operation of these dies higher speeds exacerbate this problem.

To remedy the shortcomings of external testers, built-in test circuitry is introduced on the integrated circuit for high-speed IO data path testing. Elements on the memory die itself can generate, transfer and compare data test patterns at high speeds, such as 800 MBPS or higher. A number of embodiments and variations for placing test circuitry on the memory circuit are described below, with some examples illustrated in FIGS. 4-6.

Figure 4:
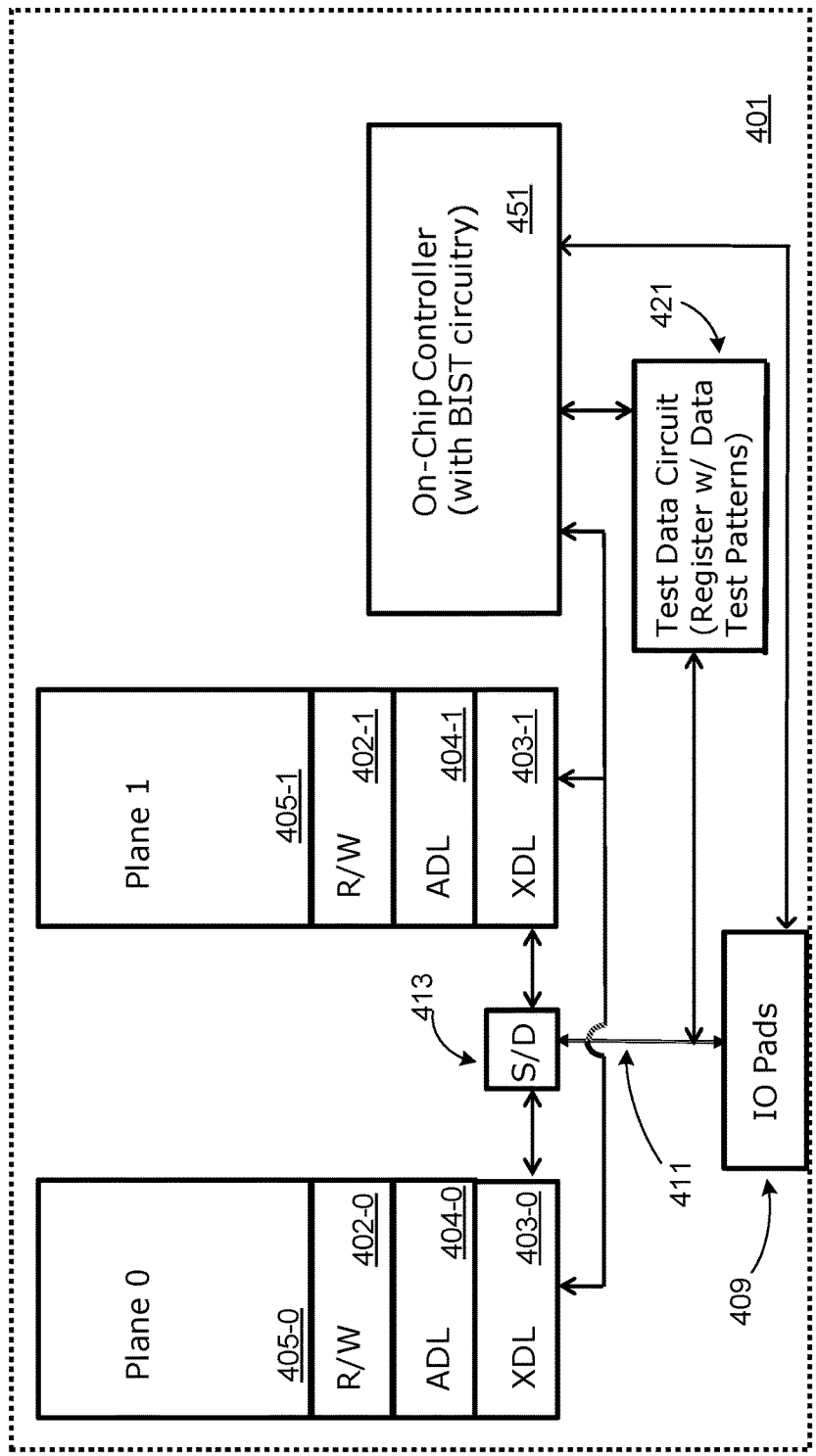
FIGS. 4-6 illustrate examples of on-chip implementations for testing of the high-speed data path without use of an external tester.
Figure 5:
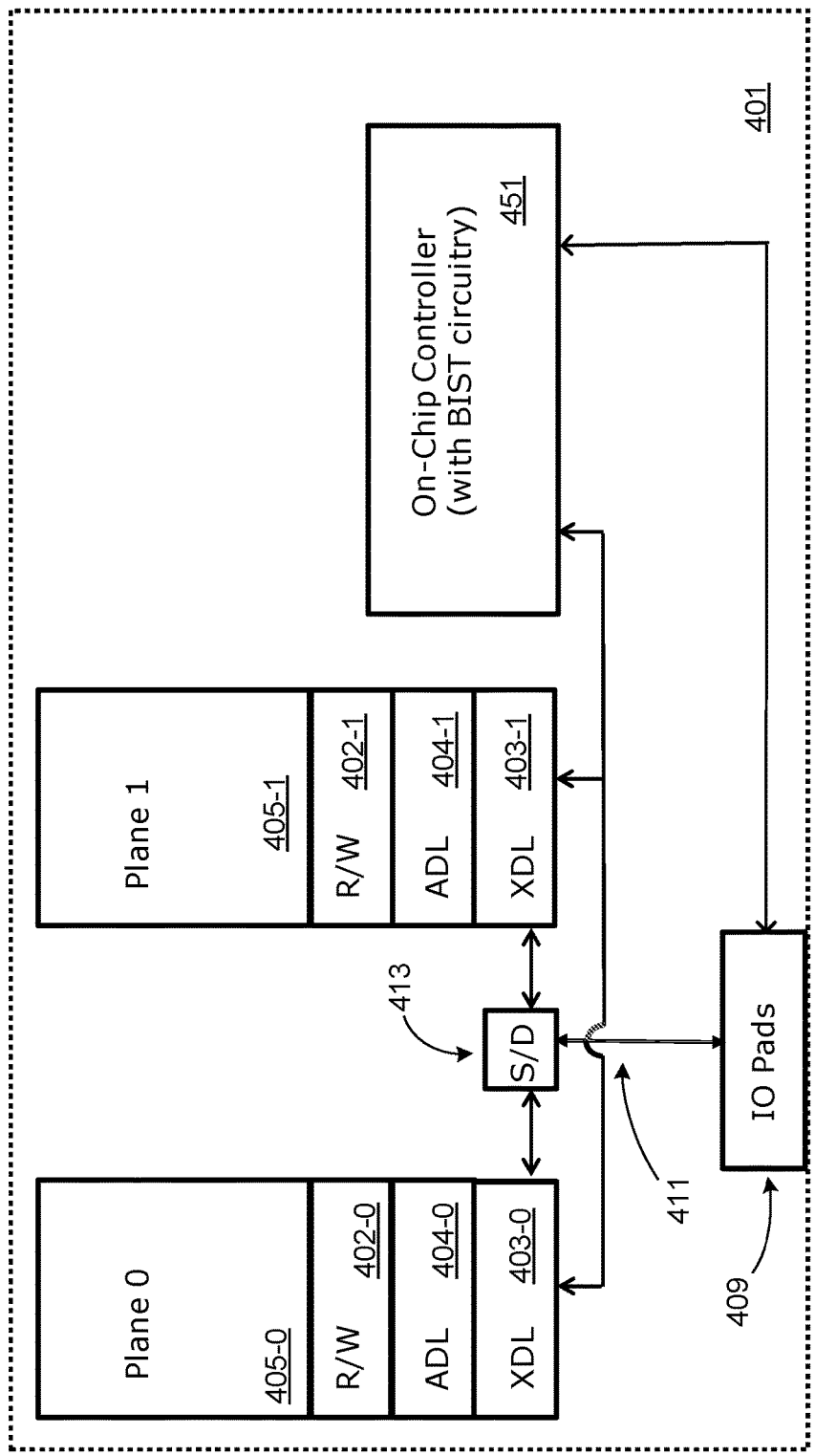

In FIG. 4, data test patterns are provided by a test data circuit 421 provided near the IO pads, where test data circuit can be a register for storing the data test patterns or a circuit to generate the data test patterns. By having the test data circuit near the IO pads, the input/output data pathway of the bus structure connecting the IO pads and the buffers associated with the read/write circuitry can be tested for high speed transfer errors. In FIG. 5, buffers (e.g. 403-0 and 403-1) associated with two different planes are directly connected over the bus structure to test this portion of the data path at high speeds, so that one, or the other, of the buffers serves as the test data circuit supplying the data test patterns. The example of FIG. 6 also uses the buffers of two planes (e.g. 403-0 and 403-1), one of which is again used as the data test circuit, but rather than connecting the buffers of the two planes directly together, they are connected by a data path looping them through separate IO paths of the bus structure to, and from, the IO pads. The various embodiments described here can be performed as part of a built-in self-test (BIST) operation, where the on-chip control circuit can be configurable to perform these operations. Each of the embodiments of FIGS. 4-6 will be discussed in more detail below.

Considering the embodiment of FIG. 4, the memory circuit includes the elements described above with respect to FIG. 3, but now also includes a data test circuit 421 to supply the data bus structure 411 with data test patterns for use in high speed data path test operations. In the embodiment of FIG. 4, the data test circuit is one or more register(s) 421 that can store the data test patterns. In other embodiments, the register of 421 can be replaced with a circuit to generate the data test pattern for the test data circuit.

The data test circuit of the register 421 can be loaded with data test patterns that, for example, alternate 1s and 0s on physically adjacent lines of the bus to better test for capacitance induced errors. The size of the register for the data test circuit 421 can be the same width as the number IO pads or as wide as the bus at maximum width, such 32 bits total if this is the width of the bus structure 411 where it connects to the XDL buffer 403-0 for plane 0 and the XDL buffer 403-1 for plane 1. Depending on circuit timing and area considerations, the register 421 could also store another 32 bits for the inverse pattern, allowing for rapid switching between the data test pattern and its inverse. Alternately, if the register area is large, simple counters can be used as a way to reduce silicon area.

FIG. 4 also shows the on-chip controller circuit 451, which can be configured to perform the high-speed data transfer test operation for the data path between the test data circuit of register 421 and the buffers XDL 403-0 of plane 0 and XDL 403-1 of plane 1. In addition to a state machine, decoders, and other typical elements described above with respect to element 110 of FIG. 1, the controller circuit 451 is also configured to include circuitry for performing the built-in self-test (BIST) operations, including the ability to compare the result of the high-speed transfer with the expected values if the data were uncorrupted. In other embodiments, the test operation can be performed by custom logic added for this purpose, including elements such as the comparison circuitry (e.g., represented at element 431 of FIG. 9 discussed below). For example, the data test pattern after the high-speed transfer can be compared with a copy transferred at a lower data rate; and if there is an error and these two values differ, then a cumulative status can be noted in a register for this test mode. As discussed further below, this comparison can be made in various ways, including providing the comparison pattern by transferring the data test pattern a second time, but at lower speed so that error is less likely to be introduced; or by transferring the data back to the register 421, where one of the transfers can be at a lower speed to help to isolate error in the different directions. By use of flipping/rotating (between 1010 . . . and 0101 . . . ) the data test values from the register 421, the patterns can be checked to verify that the pathways between the IO pads and the buffer are functioning properly at high-speed. If an error is encountered during the test sequence, a bit of a status register can be used to note the error status.

To test the bus structure 411 of FIG. 4, the register 421 serve as the test data circuit to provide a data test pattern that is transferred over the bus structure to one or both of the buffers 403-0 and 403-1. The on-chip control circuit 451 performs the high-speed transfer of the data test pattern. To test whether any error was introduced during the high-speed transfer, the control circuit 451 can either transfer the data test pattern an additional time at a lower transfer rate, which is expected to introduce less error, and compare the result of the two transfers; or, after the high-speed transfer, the data test pattern can be transferred back to the test data circuit and checked to see if any error was introduced in the round trip.

The arrangement of FIG. 4, as well those of FIGS. 5 and 6 discussed further below, can reduce test costs as high-speed memory die level testing is enabled without use of an external tester by having the on-chip controller 451 perform the test operation. The increased test coverage at the memory die level can provide high yield; and the ability to run the circuit in a self-test mode can reduce test time.

Figure 7:
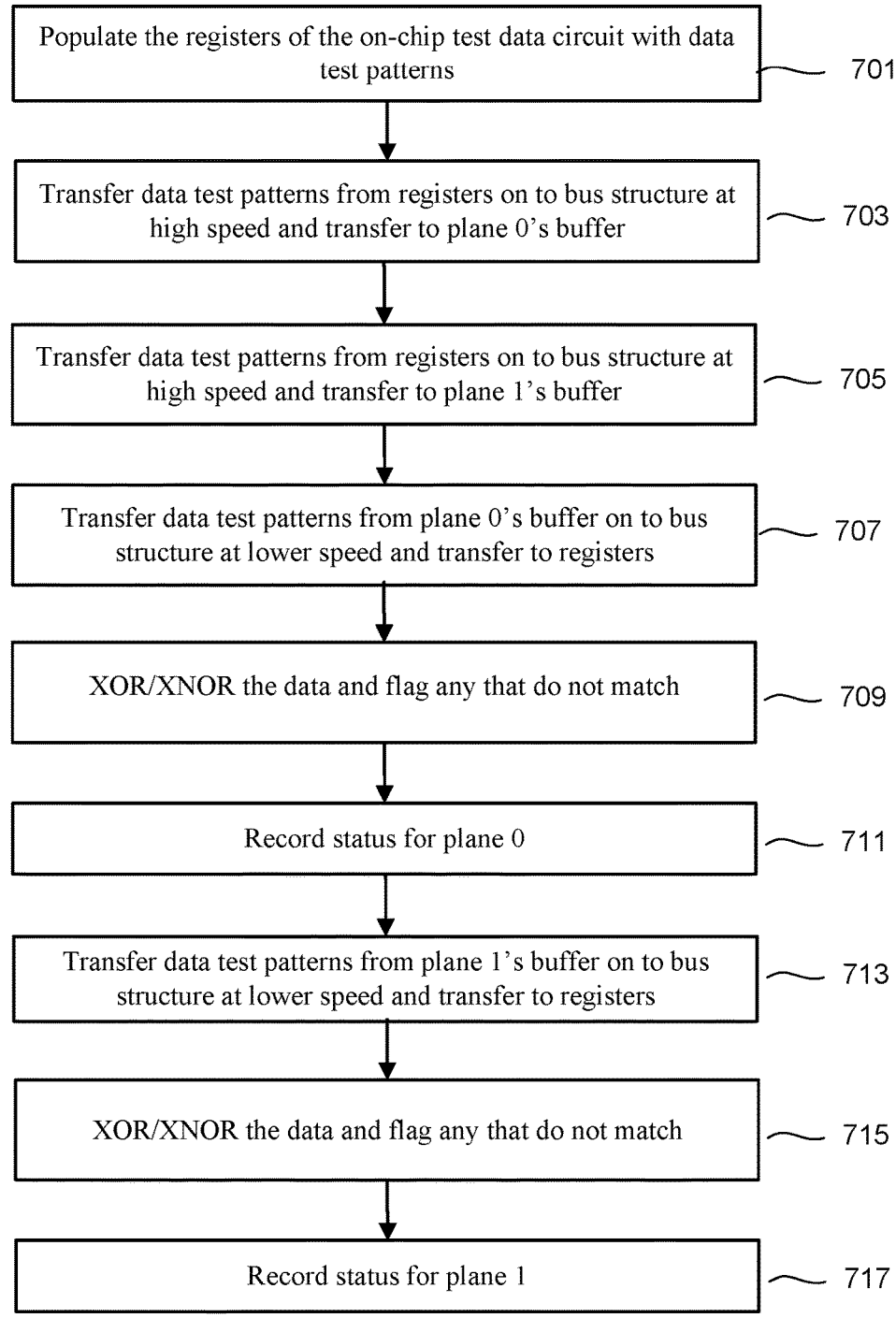
FIGS. 7 and 8 are exemplary test flows for embodiments such as those illustrated in FIGS. 4-6.

FIG. 7 is a flow chart describing one embodiment of a process for a high-speed data path test using the structure of FIG. 4. Beginning at step 701, the on-chip test data circuit of register 421 is populated with the data test patterns, if there are not already present. In embodiments where the test data circuit is not a register, but instead generates the data test patterns, these are generated at step 701. The patterns are then transferred from the register 421 on to the bus structure 411 at high speed at step 703, sending them to plane 0's XDL buffer 403-0. If the device includes multiple planes, such as the dual plane exemplary embodiment, one or more of the other planes can also be incorporated into the flow, either sequentially or overlapping the operations to varying degrees. In this example, at step 705 the patterns are transferred from the register 421 on to the bus structure 411 at high speed and transferred to plane 1's XDL buffer 403-1.

The result of the high-speed transfer can be checked by comparing the data test pattern as transferred with the result that would be expected if there were no error in several ways. For example, it could be transferred back to the register 421 for comparison, where the transfer of the data test pattern back also could be at high-speed (to indicate error accumulated in both the read and write directions) or at a lower rate, to focus on error in the pad-to-buffer direction. The high-speed and lower speed directions can be swapped to focus on the buffer-to-pad direction. It should be noted that the error introduced in the two directions may differ as, for example, one direction may involve serialization circuits and the other direction may involve deserialization circuits.

When both transfers are in the same direction, after a first, high-speed transfer the data test pattern can be shifted from the XDL buffers 403-0 and 403-1 to the ADL buffers 404-0 and 404-1, respectively, prior to a second transfer; or, depending on the bus structure's topology, the second transfer could be directly into the ADL buffers 404-0 and 404-1. The flow of FIG. 7 uses a second, lower rate to transfer the data from the XDL buffers 403-0 and 403-1 back toward the register 421.

At step 707, the data test patterns in plane 0's XDL buffer 403-0 are forwarded on to the bus structure 411 and back toward register 421 using a second, lower clock rate transfer. The lower (or standard) speed transfer used in step 707 is not expected to introduce the sort of error that may occur for the high-speed transfer. To check for error, the returned data test pattern can be compared against the original values for the data test pattern by a bit-wise XOR/XNOR operation at step 709, such as by the on-chip control circuitry 451 or logic elements introduced for this purpose (e.g., represented at element 431 of FIG. 9 discussed below). If any of the bits do not match, the controller can set an error flag. This flag can be a one-bit register that can be externally accessed to determine if the memory die has failed the test operation and should not be used. The plane 0 status can then be recorded into an externally accessible register at step 711. Steps 707, 709, and 711 are then repeated for plane 1 at steps 713, 715, and 717. The flow of FIG. 7 can be used to perform a test operation for a single plane by omitting steps 705, 713, 715, and 717, which are specific to plane 1. If an error flag is set for one or more planes, the whole die can be treated as defective, or can alternately only use any non-defective planes or, in other cases, limited to low speed operation.

The test operation of FIG. 7 uses the register 421 of FIG. 4 as the test data circuit. When a memory circuit has multiple planes, other options are available for the test data circuit. For example, the buffer of one of the planes can serve as the test data circuit to provide the data test pattern that is transferred to another one of the planes. FIG. 5 shows an alternate embodiment, which repeats most of the elements FIG. 4, but without the register 421. To test the high-speed data path, the buffer for one plane, say XDL 403-1 of plane 1, is used as the test data circuit. The data test pattern is then transferred directly across the bus structure 411 to the XDL buffer 403-0 of plane 0. The result of the transfer can then be shifted in plane 0's buffers from the XDL buffer 403-0 to the ADL buffer 404-0, after which the transfer can be repeated, but at a lower speed. Afterwards, the contents of the XDL buffer 403-0 are compared by the control circuit 451 or other logic on the die to the contents of ADL buffer 404-0 and checked for any discrepancies, indicating error in the high-speed transfer. The process can then be repeated in the other direction to check the direct path from XDL 403-0 to XDL 404-1 for this section of the bus structure 411.

Although testing the entire IO pathway of the bus structure 411 from the IO pads 409 to the buffers 403-0 and 403-1 may sometimes be preferable, testing the buffers of the different planes and the portion of the bus structure 411 connecting these buffers can help to minimize silicon area and design effort as this does not introduce the additional elements, such as the register 421 of FIG. 4. It should be noted that these different embodiments are not exclusive and, depending on the device's topology, may be used to test different parts of the bus structure in a complementary manner.

Figure 8:
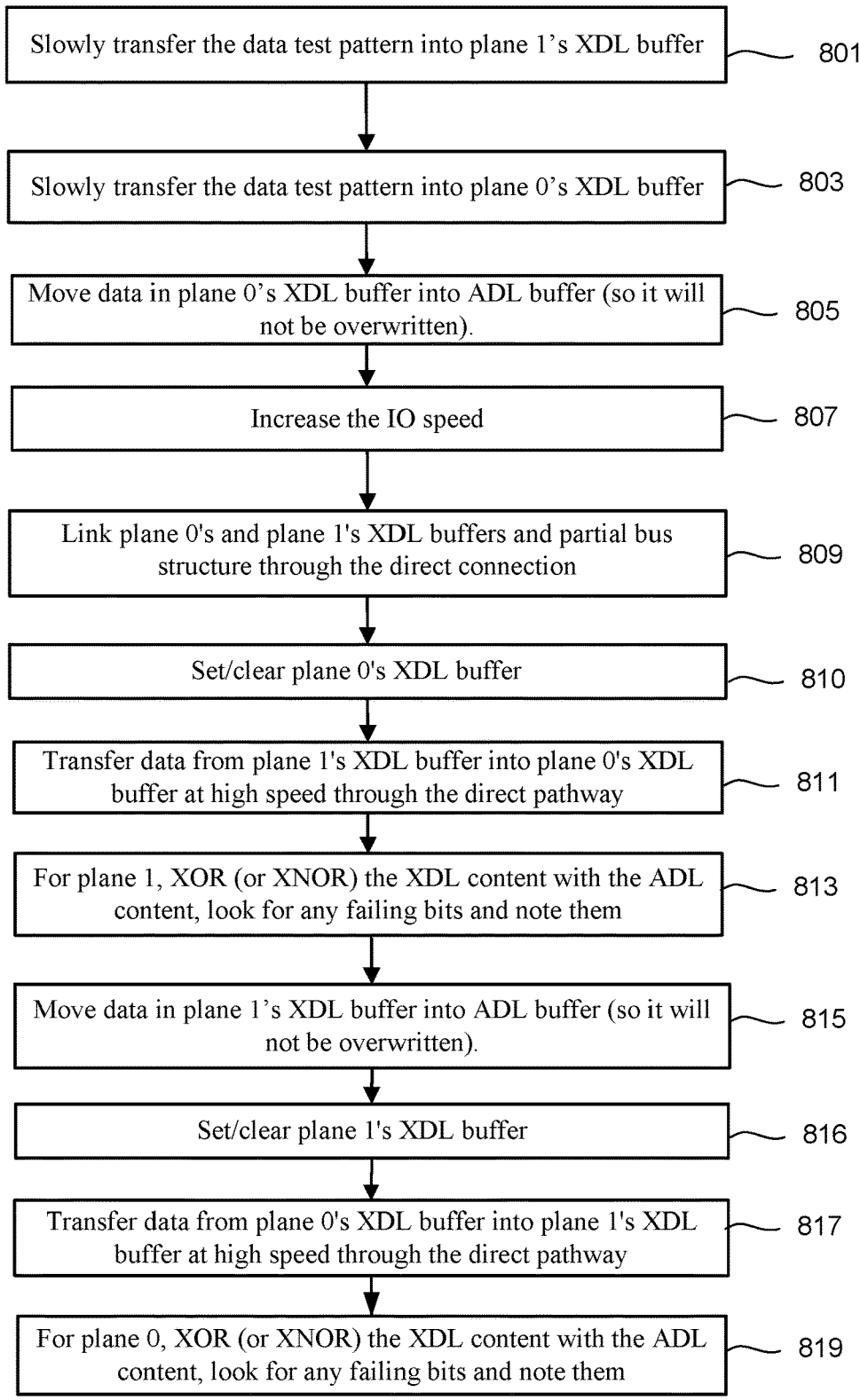

FIG. 8 is a flow chart describing one embodiment of a process for a high-speed data path test using the structure of FIG. 5. Starting at 803, the data test pattern is transferred at a relatively low data rate to the XDL buffer 403-1 of plane 1 at 801. For example, the fairly typical rate for a memory circuit of 400 MBPS or even lower rates can be used to increase the integrity of the data transfer. This is repeated for plane 0's XDL buffer at step 803. Depending on the device's structure, it may be possible to perform 801 and 803 concurrently. As the lower rate is expected to introduce less error, this transferred data test pattern can be taken as the reference copy of the expected, uncorrupted values. In the flow of FIG. 8, the high-speed (e.g., 800 MBPS or higher) transfer in the plane 1 to plane 0 direction is performed first, so at step 805 the content in plane 0's XDL buffer 403-0 is moved to the ADL buffer 404-0 to avoid it being overwritten at 811.

The transfer speed can then be increased at step 807 by increasing the clock rate. The bus structure 411 is then configured through the appropriate switching circuitry by the on-chip control circuit 451 at step 809 to link the buffer 403-0 of plane 0 to the buffer 403-1 of plane 1 over the bus structure 411. At step 810 plane 0's XDL buffer 403-0 is cleared, after which the data test pattern is transferred at high speed from plane 1's XDL buffer 403-1 over the bus structure 411 to plane 0's XDL buffer 403-0 in step 811. Depending on the topology of the bus structure 411, this may or may not involve the serializer/deserializer circuits 413. At step 813 the resultant values of data test pattern after the high-speed transfer are then compared to the data test pattern after the low speed transfer by a bit-wise XOR-ing (or XNOR-ing) of the two, looking for any failing bits and noting them.

The high speed data path in the other direction can then be checked by repeating the process in the reverse direction: moving the data in the XDL buffer 403-1 to the ADL buffer 404-1 in plane 1 (so it will not be overwritten) at step 815; clearing plane 1's XDL buffer 403-at 816; transferring the data test pattern from plane 1's XDL buffer 403-1 into plane 0's XDL buffer 403-0 at high speed through the direct IO pathway at step 817; and, at step 819, XOR-ing (or XNOR-ing) the data test pattern as stored in the XDL buffer 403-1 of plane 1 with the data test pattern as stored in the XDL buffer 403-0 of plane 1, looking for any failing bits and noting them.

By switching the source and destination roles of the buffers in plane 0 and plane 1, the flow of FIG. 8 can allow testing in both directions for the bus structure 411. The cumulative status of these transfers can then indicate the presence of a defective bus structure. Additionally, the shifting of roles between the different planes' buffers as the test data circuit can alternately be done by transferring a smaller number of bytes (i.e., less than a full page) of a data test pattern, where the data can be cached for this smaller number of bytes, followed by a comparison by reading out the buffers at slower speeds to check the patterns.

Figure 6:
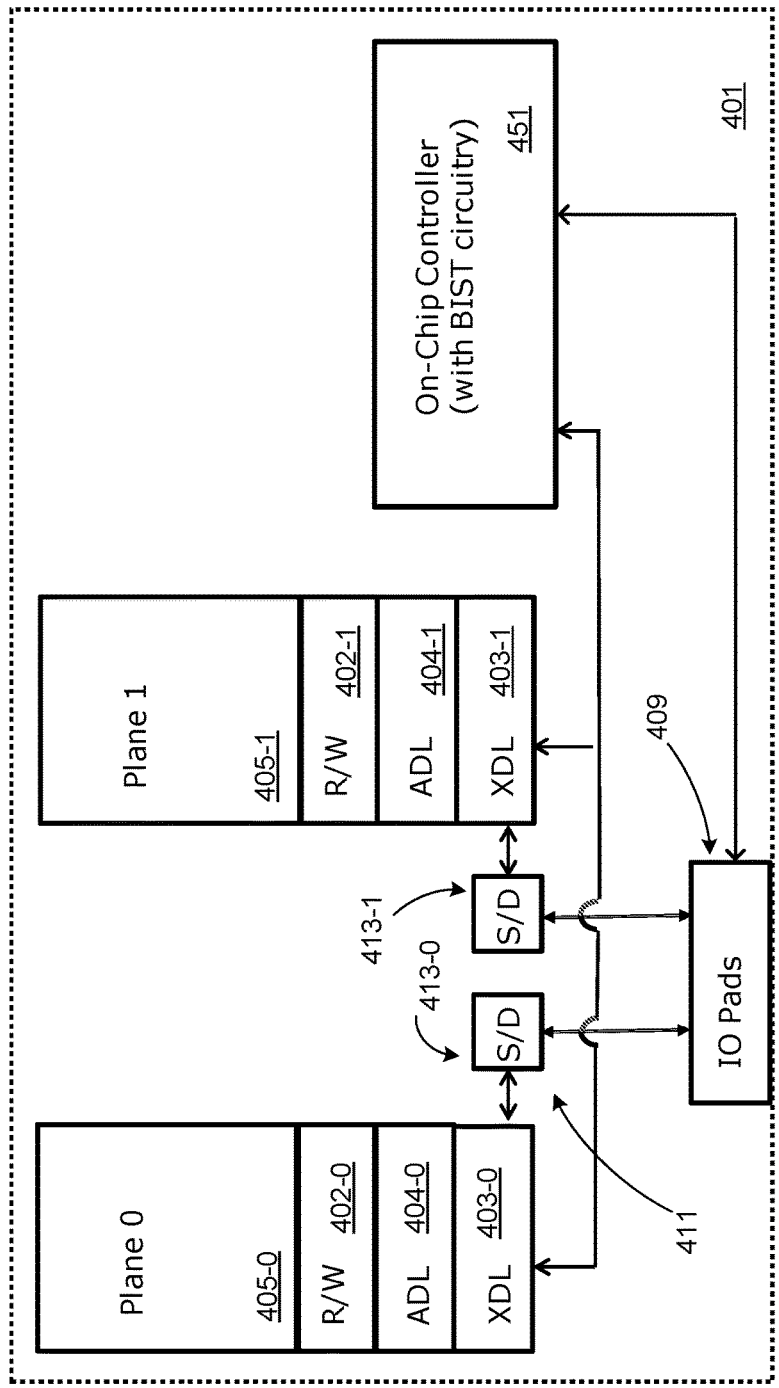

The embodiment of FIG. 6 includes the same elements as in FIG. 5, but the bus structure 411 has a different topology that includes separate paths between the IO pads 409 and each of the buffers of XDL 403-0 and XDL 403-1. The embodiment of FIG. 6 also includes separate serializer/deserializer circuits 413-0 and 413-1 for each of these paths. If these paths allow data to be independently transferred between the IO pads 409 and the different planes' buffers, a different test path can be used than was described for FIG. 5 in the flow of FIG. 8. The bus structure 411 of FIG. 6 allows for an IO loop, where the test data passes from the buffer of one plane (e.g., XDL buffer 403-1 in plane 1), to the IO pad area 409, and then to the buffer of the other plane (e.g., XDL buffer 403-0 in plane 0). Additionally, the loop to the alternate plane can allow for both planes can to be fed data at the same time, thus reducing the data test pattern input time by a factor of two during testing. An exemplary test operation using the arrangement of FIG. 6 can be similar to that described with respect to FIG. 8 for the embodiment of FIG. 5, except that the link established at 809 would now link the XDL buffer in 403-0 of plane 0 to the XDL buffer 403-1 of plane 1 through the IO pads 409, rather than the sort of direct connection used with FIG. 5.

Returning to the embodiment of FIG. 4, in the flow of FIG. 7 the data was transferred from the register 421 to the buffer 403 in one direction at high speed and back in the other direction at low speed, where the comparison is made to determine whether any error has been introduced during the round trip. In alternate embodiments, both transfers can be made in the same direction. This variation is described further with respect to FIGS. 9-12.

Figure 9:
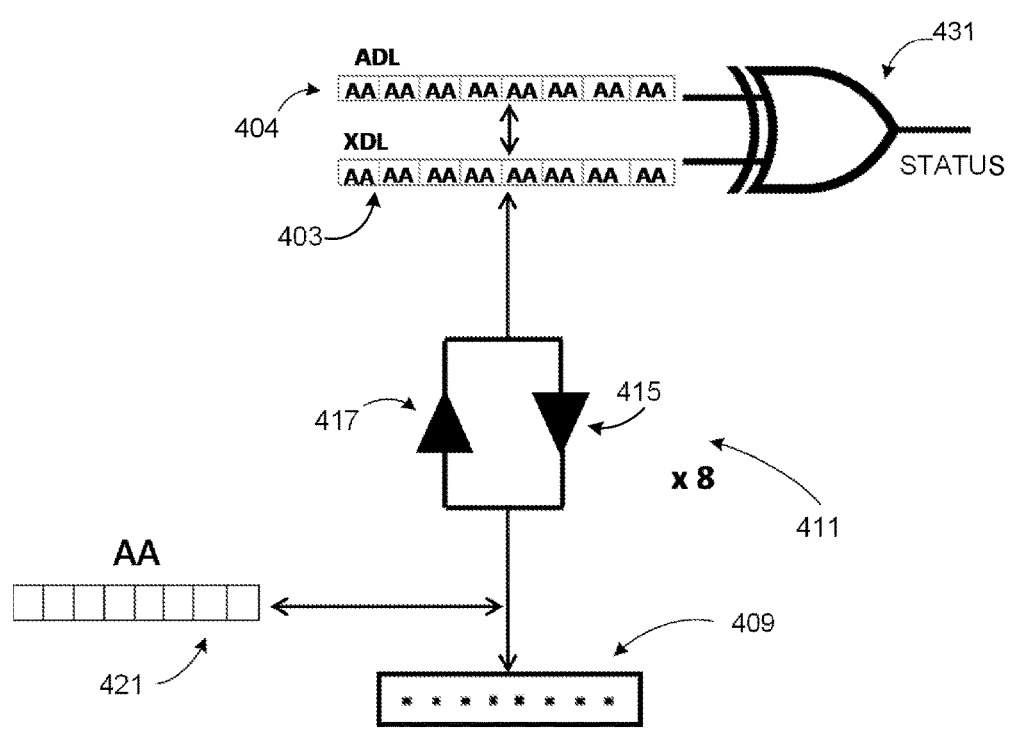
FIG. 9 shows detail of FIG. 4 relevant to the flows of FIGS. 10 and 11.

The embodiment of FIG. 9 uses a register 421 as the data test circuit, as was the case in the embodiment of FIG. 4. In FIG. 9, the number of IO pads 409 is eight, with each pad connected a line of the bus structure 411, where one line of the bus structure 411 is explicitly shown. Elements of bus structure 411 along the path from the IO pads and test register to the buffers XDL 403 and ADL 404, such as drivers and serializer/deserializer circuits (e.g., S/D 413 of FIG. 4), are schematically represented as an input driver 417 and output driver 415. A similar structure would be repeated for each of the other 7 of the IO pads 409. To reduce the amount of capacitance seen by the bus, the data test circuit of register 421 stores only one bit per pad of the IO pad 409, corresponding to a total of one byte of data for the data test pattern. An example data test pattern is the byte (10101010), or 0xAA in hexadecimal notation, as shown "AA" above the register 421. Although the example test pattern here is 0xAA, the date need not be a repeating byte (like 0xAA, 0xAA, 0xAA . . . ). For example, in other embodiments it can be alternating (like 0xAA, 0x55, 0xAA, 0x55, . . . ; or like 0x33, 0xCC, 0x33, 0xCC, . . . ; or any other alternating bytes) or other, more general patterns.

The bus structure 411 connects to an XDL buffer 403, which in turn connects to an ADL buffer 404, which are shown for only a single plane. (The associated read/write circuits and plane of memory cells are not shown, but would be as in FIG. 4 for R/W 402-0 and 404-0, respectively, for Plane 0.) In transferring the data test pattern 0xAA from the register 421 along the data path over the to the bus structure 411 to the XDL buffer 403, the pattern can be transferred one byte at a time until the XDL buffer 403 is filled. Once the XDL buffer 403 is filled, its contents can then be transferred into the ADL buffer 404, after which the XDL buffer 403 can be set/cleared and filled again with the data test pattern. If the transfers are without error, both the XDL buffer 403 and the ADL buffer 404 would be filled with a string of all 0xAA data, as shown as "AA" in FIG. 9. In FIG. 9 and also in FIG. 12 below, the register is shown as being a byte wide, corresponding the number of the IO pads 409 and also to the width of the bus structure 411 at the IO pads 409, but other sizes can be used. Similarly, the ADL buffer 404 and XDL buffer 403 are shown as storing in segments of 1 byte, in the example, to correspond to a 1 byte part of the bus structure 411, but these segments can be larger to cover different widths that may exist within the bus structure 411: for example, if the bus structure 411 include serializer/deserializer circuits, the bus structure may be 1 byte wide at the IO pads 409, but several bytes wide at the XDL register 403 and this would be reflected in the buffer segments' width.

Figure 10:
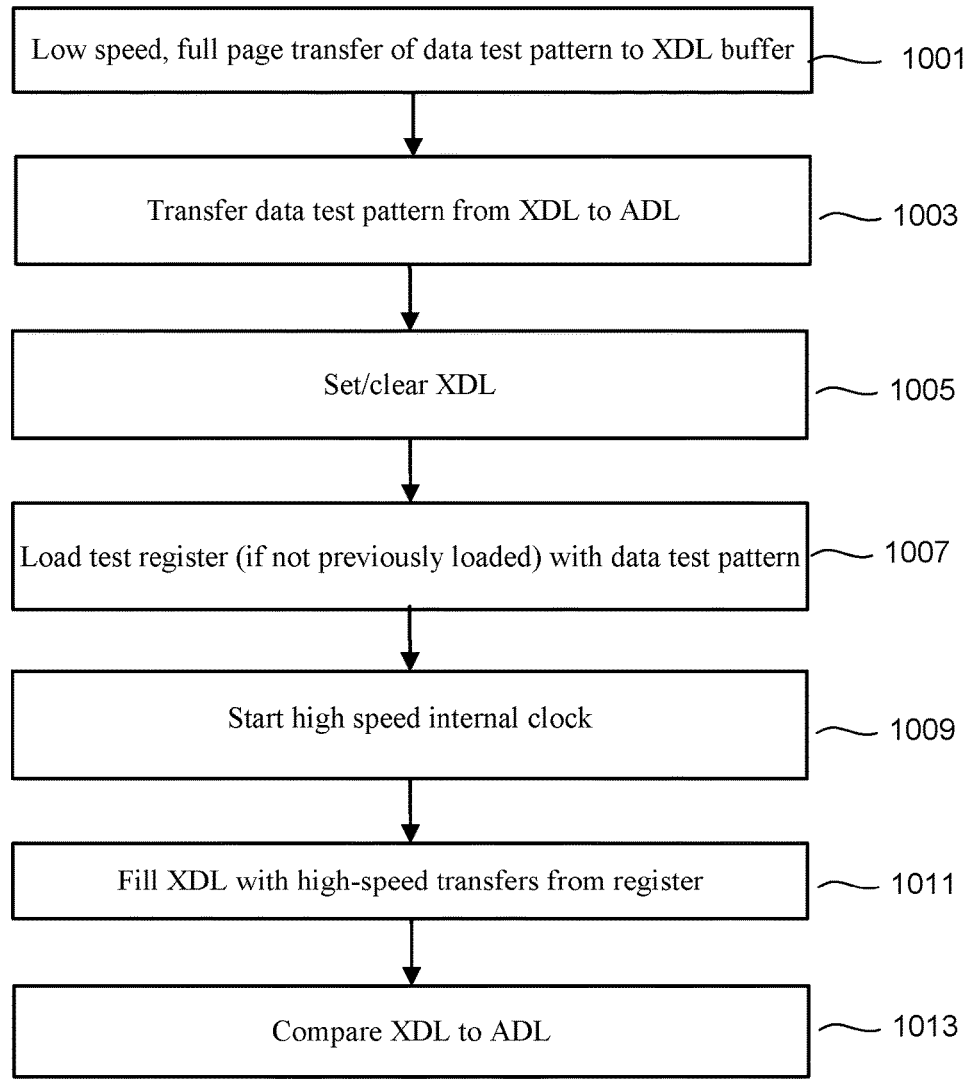
FIGS. 10 and 11 are alternate test flow embodiments.
Figure 11:
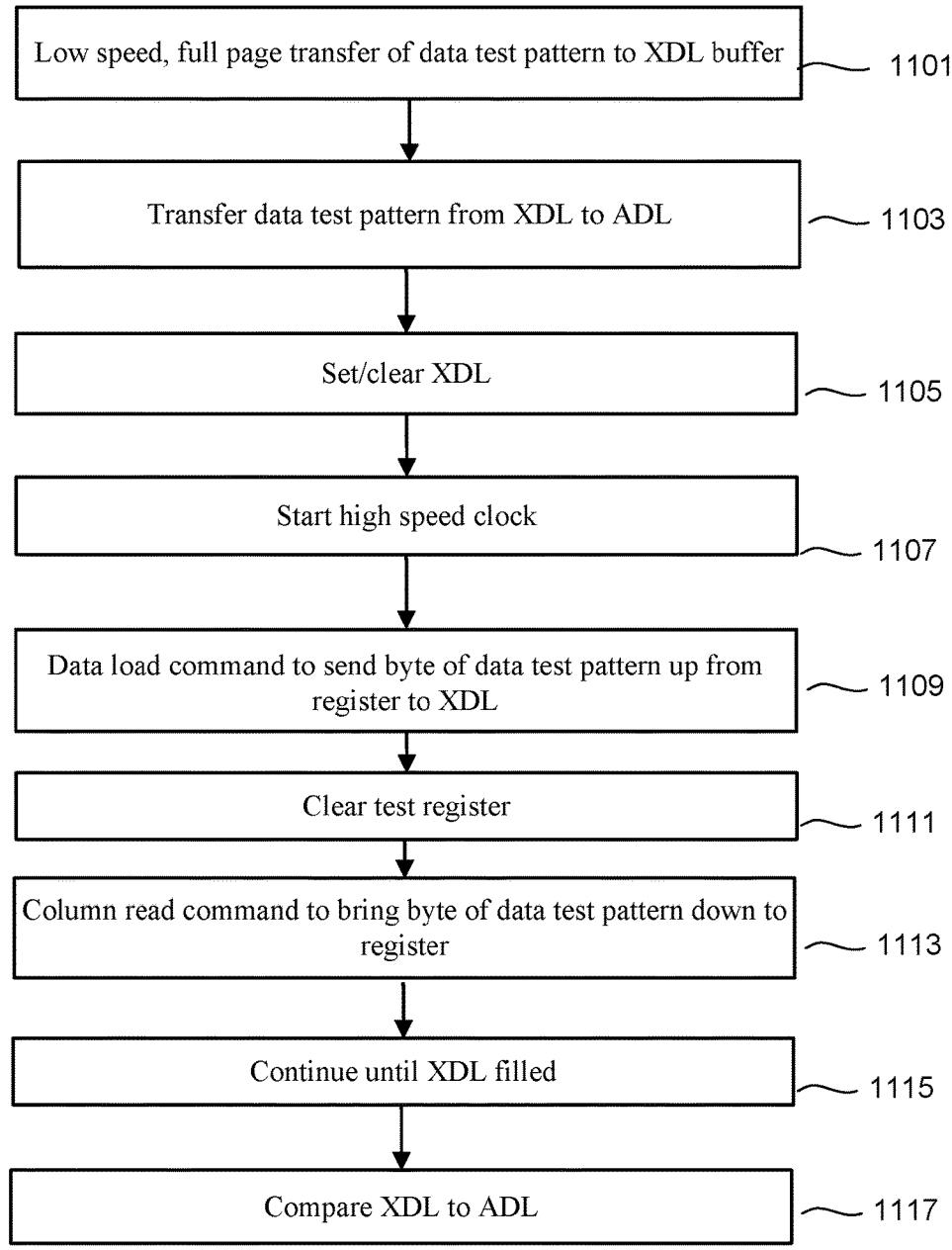
Figure 12:
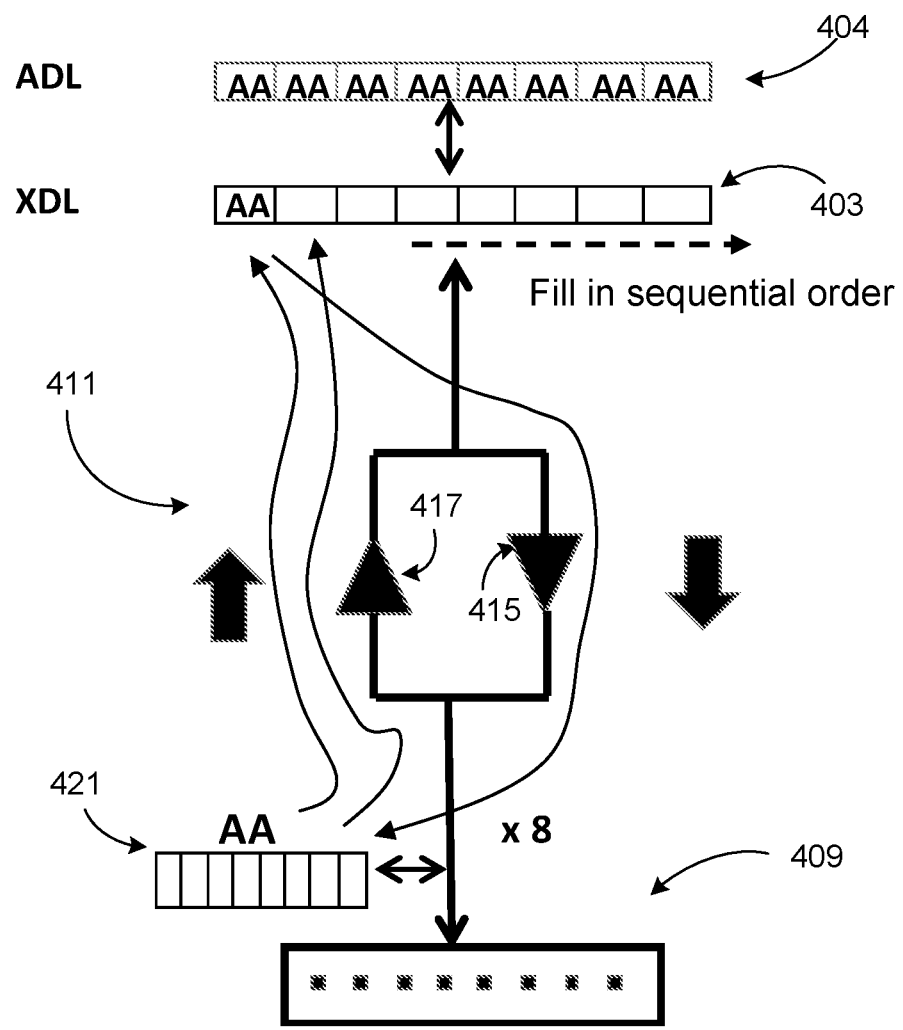
FIG. 12 is a schematic representation of part of the flow of FIG. 11.

To check for error in the high-speed data path, one of these set of transfers to the XDL buffer 403 can be a low-speed transfer, to provide the reference copy of the data, and the other a high-speed transfer. The flows of FIGS. 10 and 11 give two embodiments where first transfer to the XDL buffer 403 and then on to the buffer ADL 404 is a low speed transfer and the second transfer to the XDL buffer 403 is a high-speed transfer. To check for error in the high-speed transfer, the contents of the XDL buffer 403 and ADL buffer can then be compared by, for example, a bit-wise XOR or XNOR operation. Depending on the embodiment, this can be done by logic circuitry connected to the XDL buffer 403 and ADL buffer for this purpose, as represented by logic gate 431, or with the on-chip controller (451 of FIG. 4, not shown in FIG. 9) or some combination of these and other elements of the memory die's control and test circuitry.

The result of the compassion give a status for the bus structure 411 connecting the IO pads 409 to the plane associated with the XDL buffer 403 and ADL buffer 404. This result can then be stored as an error flag in an externally accessible register to provide status on whether the memory die is defective.

FIG. 10 is a flow chart describing one embodiment of a process for an internal high-speed data path test for a single plane using the structure of FIG. 9. Starting at step 1001, a full page of data is loaded a byte at a time into the XDL buffer 403 using a relatively low data rate, such as using the memory die's standard (i.e., not high-speed) data clock. The transfer of step 1001 can be can be a transfer of the data test pattern from the register 421 or the data test pattern can be loaded from other sources on the memory die. The test data pattern is then transferred from the XDL buffer 403 to the ADL buffer 404 at step 1003, after which the XDL buffer 403 is set/cleared at step 1005. As the transfer of step 1001 was at low speed, the data in buffer ADL buffer 404 can be treated as a page of the expected data test pattern, representing the data test pattern without introduced error.

If the low data rate transfer in step 1001 was not made from the register 421 (or the register 421 is otherwise not loaded with the data test pattern), the register 421 is loaded with the data test pattern at step 1007. At step 1009, a high speed clock can be started, followed by a byte by byte (in this example), high-speed transfer of the data test pattern from the register 421 to the XDL buffer 403 until the XDL buffer 403 is filled at step 1011. Depending on the embodiment, the high speed clock can be internally or externally supplied, or, for example, an external clock that is stepped up by a frequency multiplier on the device. At this point (assuming there had been no error in the high-speed transfer), the XDL buffer 405 and the ADL buffer 404 will be filled with the test data as shown (all AAs in this example). Any error in the high-speed transfer will be reflected in the XDL values not matching the ADL values, where this can be checked as at step 1013 by a bit-wise XOR-ing or XNOR-ing of the contents of the two registers. The test result can then be stored in an externally accessible register so that the memory can be checked on whether it is usable for high-speed applications.

FIG. 11 is a flow chart describing another embodiment of a process for an internal high-speed data load and read test using the structure of FIG. 9. Steps 1101, 1103, and 1105 largely repeat steps 1001, 1003, and 1005 from FIG. 10:

where step 1101 uses the register 421 for loading of the XDL buffer 403 at the relatively low data rate; at step 4113 the content of the XDL buffer 403 is transferred to the ADL buffer 404; and the XDL buffer 403 is set/cleared at step 1105. The high speed clock is started at step 1107, raising the transfer rate to, say, 800 MBPS or higher. As noted before, the high speed clock can be internally or externally supplied, or, for example, an external clock that is stepped up by a frequency multiplier on the device.

The XDL buffer 403 begins to load at the high speed at step 1109. Rather than repeatedly sending the byte of the data test pattern (AA in this example) from the register 421 to the XDL buffer 403 until filled (as in the flow of FIG. 10), in the flow of FIG. 11 this is instead done with a data load command that sends the data test pattern up to the XDL buffer 403 at step 1109, after which the register 421 is set/cleared at step 1111, followed by reading the just transferred data test pattern back from XDL buffer 403 into the register 421 at step 1113. This is illustrated schematically in FIG. 12 for the first two transfers, where the pattern data pattern is loaded into the first byte of the XDL buffer 403, read back out from the XDL buffer 403 to the register 421, and then transferred back up to fill the XDL buffer 403 sequentially.

This back and forth filling of XDL buffer 403 is continued byte by byte at step 1115 until the XDL buffer 403 is filled, where the address can be automatically incremented with the clock. Due to the back-and-forth process, the content transferred into the XDL buffer 403 for each byte will reflect the cumulative error introduced over the course of this back and forth process. At step 1117, the low transfer rate data test pattern in ADL buffer 404 can then be compared to the high transfer rate data test pattern in XDL buffer 403 as in step 1013. As with the previous embodiments, this process can be performed as a built-in self-test (BIST) process. The result of the test can then be stored as an error flag in an externally accessible register, which can be checked to determine if the memory die is defective.

The examples described above have mainly been presented in the context of a non-volatile memory device having two planes of memory cells on a die. More generally, the memory cells need not be non-volatile, but could, for example be DRAM cells. Additionally, the number of planes can be more than two or, when the data test circuit is not the read/write buffer of another plane, only a single plane.

With respect to the read/write buffers, although primarily referred to as buffers in the preceding discussion, these are more generally variously referred to as latches, cache, registers, or buffers. In a typically implementation, these will be a set of latches holding a page of data, where a page is the unit of data for the writing data to or reading data from (or, commonly, both) an array, where it is referred to as a page cache or page buffer. More generally, the buffer need not be for an entire page. Additionally, although discussed in the context of planes of memory cells on the die, these can more generally just be groups of memory cells on the die, each with their own corresponding read/write buffers.

One embodiment is an apparatus that includes an integrated circuit. The integrated circuit has a group of memory cells and a buffer connected to the group and configured to store data read from, or to be written to, the memory cells of the group. The integrated circuit also includes multiple data input/output pads, a bus structure connecting the data input/output pads to the buffer, and a test data circuit configured to provide a data test pattern to the bus structure. The integrated circuit additionally has a control circuit connected to the first buffer and the test data circuit. The control circuit is configured to perform a first transfer of the data test pattern over the bus structure at a first data rate to the first buffer and to perform a second transfer of the data test pattern over the bus structure at a second data rate from the test data circuit to the first buffer, where the second data rate is higher than the first data rate. The control circuit is also configured to compare the data test pattern after the first transfer to the data test pattern after the second transfer to determine whether the data test pattern after the second transfer differs from the data test pattern after the first transfer.

In another exemplary embodiment, an apparatus includes an integrated circuit having a group of memory cells and a buffer connected to the first group and configured to store from, or to be written to, the memory cells of the group. The integrated circuit also has a plurality of data input/output pads, a bus structure connecting the data input/output pads to the buffer, a test data circuit configured to provide a data test pattern to the bus structure. The integrated circuit additionally includes a control circuit connected to the first buffer and the test data circuit. The control circuit is configured to perform a first transfer of the data test pattern over the bus structure at a first data rate from the test data circuit to the first buffer, a subsequent second transfer of the data test pattern over the bus structure at a second data rate from the first buffer back to the test data circuit, wherein the first data rate and the second data rate differ. The control circuit is also configured to compare the data test pattern prior to the first transfer with the data test pattern after the second transfer to determine whether the data test pattern after the second transfer differs from the data test pattern prior to the first transfer.

Other exemplary embodiments present an apparatus that includes an integrated circuit having an array of memory cells and a buffer configured to store data read from, or to be written to, the array. The circuit also has a plurality of data input/output pads and a data path including a bus structure connecting the data input/output pads to the buffer. Additionally, the integrated circuit includes a means for providing a data test pattern to the data path and a means for performing a built-in self-test operation of the data path by transferring the provided data test pattern over the data path between the buffer and the means for providing the data test pattern to the data path.

In various embodiments, a means for providing a data test pattern to the data path may include a register 421 configured to store the data test pattern, a circuit configured to generate the data test pattern, a buffer on the integrated circuit used to store the data test pattern, or other circuitry. Other embodiments may include similar or equivalent means for providing a data test pattern to the data path.

In various embodiments, a means for performing a built-in self-test operation of the data path may include an on-chip controller 451, the control circuitry 110 and elements contained therein, logic gate 431, custom logic added for this purpose, other logic hardware, and/or other executable code stored on a computer readable storage medium, wherein the self-test operation can be performed by various combinations of hardware, software and firmware. Other embodiments may include similar or equivalent means for performing a built-in self-test operation of the data path.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   an integrated circuit comprising:
      a first group of memory cells;
      a first buffer connected to the first group of memory cells and configured to store data read from, or to be written to, the memory cells of the first group of memory cells;
      a plurality of data input/output pads;
      a bus structure connecting the data input/output pads to the first buffer;
      a test data circuit configured to provide a data test pattern to the bus structure; and
      a control circuit connected to the first buffer and the test data circuit, the control circuit configured to perform a first transfer of the data test pattern over the bus structure at a first data rate to the first buffer and to perform a second transfer of the data test pattern over the bus structure at a second data rate from the test data circuit to the first buffer, wherein the second data rate is higher than the first data rate, and wherein the control circuit is configured to compare the data test pattern after the first transfer to the data test pattern after the second transfer to determine whether the data test pattern after the second transfer differs from the data test pattern after the first transfer.

2. The apparatus of claim 1, wherein the test data circuit is configured to generate the data test pattern.

3. The apparatus of claim 1, wherein the test data circuit includes a register connected to the bus structure and configured to store the data test pattern.

4. The apparatus of claim 3, wherein the register is configured to store one bit of data for each of the data input/output pads.

5. The apparatus of claim 4, wherein the second transfer includes transferring the data test pattern from the register to first buffer and repeatedly reading back the data test pattern from the first buffer and re-transferring contents of the register to the first buffer until the first buffer is filled.

6. The apparatus of claim 5, wherein the integrated circuit further includes:
   a second buffer connected to the first buffer to store of data received therefrom, and connected to the first group of memory cells and configured to store data read from, or to be written to, the memory cells of the first group of memory cells,
   wherein the first transfer includes filling the first buffer with the data test pattern and subsequently transferring the data test pattern from the first buffer to the second buffer prior to the second transfer.

7. The apparatus of claim 6, wherein the control circuit is configured to perform a bit by bit comparison of the contents of the first buffer with the contents of the second buffer.

8. The apparatus of claim 1, further comprising:
   a second group of memory cells,
   wherein the test data circuit is a second buffer connected to the second group of memory cells and configured to store data read from or to be written to the second group of memory cells.

9. The apparatus of claim 1, further comprising:
   a second group of memory cells;
   wherein the test data circuit is a second buffer connected to the second group of memory cells and configured to store data read from or to be written to the second group of memory cells,
   wherein the bus structure includes independent paths between the first buffer and the data input/output pads and between the second buffer and the data input/output pads, and
   wherein the first transfer of the data test pattern and the second transfer of the data test pattern are each a transfer of data stored in the second buffer to the data input/output pads and subsequently from the data input/output pads to the first buffer.

10. The apparatus of claim 1, wherein the bus structure has a first width where connected to the data input/output pads and a second width where connected to the first buffer, the second width being greater than the first width, and wherein the bus structure including a serializer/deserializer circuit connected between a part of the bus structure with the first width and a part of the bus structure with the second width.

11. The apparatus of claim 1, wherein the first group of memory cells comprises a memory array of a monolithic three-dimensional semiconductor memory device in which the memory cells are arranged in multiple physical levels above a silicon substrate and comprise a charge storage medium.

12. The apparatus of claim 1, wherein the integrated circuit further includes:
   a second buffer connected to the first buffer to store of data received therefrom, and connected to the first group of memory cells and configured to store data read from, or to be written to, the memory cells of the first group of memory cells, wherein one of the first transfer and the second transfer includes transferring the data test pattern to the first buffer and subsequently transferring the data test pattern from the first buffer to the second buffer, wherein the other of the first transfer and the second transfer includes transferring the data test pattern to the first buffer, and wherein the control circuit compares the data test pattern after the first transfer to the data test pattern after the second transfer by subsequently comparing the data test pattern as stored in the first buffer to the data test pattern as stored in the second buffer.

13. An apparatus, comprising:
an integrated circuit comprising:
a first group of memory cells;
a first buffer connected to the first group of memory cells and configured to store data read from, or to be written to, the memory cells of the first group of memory cells;
a plurality of data input/output pads;
a bus structure connecting the data input/output pads to the first buffer;
a test data circuit configured to provide a data test pattern to the bus structure; and
a control circuit connected to the first buffer and to the test data circuit, the control circuit configured to perform a first transfer of the data test pattern over the bus structure at a first data rate from the test data circuit to the first buffer and a subsequent second transfer of the data test pattern over the bus structure at a second data rate from the first buffer back to the test data circuit, wherein the first data rate and the second data rate differ, the control circuit is configured to compare the data test pattern prior to the first transfer with the data test pattern after the second transfer to determine whether the data test pattern after the second transfer differs from the data test pattern prior to the first transfer.

14. The apparatus of claim 13, wherein the test data circuit is configured to generate the data test pattern.

15. The apparatus of claim 13, wherein the test data circuit includes a register connected to the bus structure and configured to store the data test pattern.

16. The apparatus of claim 13, further comprising:
a second group of memory cells,
wherein the test data circuit is a second buffer connected to the second group of memory cells and configured to store data read from or to be written to the second group of memory cells.

17. The apparatus of claim 13, further comprising:
a second group of memory cells;
wherein the test data circuit is a second buffer connected to the second group of memory cells and configured to store data read from or to be written to the second group of memory cells,
wherein the bus structure includes independent paths between the first buffer and the data input/output pads and between the second buffer and the data input/output pads,
wherein the first transfer of the data test pattern is a transfer of data stored in the second buffer to the data input/output pads and subsequently from the data input/output pads to the first buffer, and
wherein the second transfer of the data test pattern is a transfer of data stored in the first buffer to the data input/output pads and subsequently from the data input/output pads to the second buffer.

18. The apparatus of claim 13, wherein the bus structure has a first width where connected to the data input/output pads and a second width where connected to the first buffer, the second width being greater than the first width, and wherein the bus structure including a serializer/deserializer circuit connected between a part of the bus structure with the first width and a part of the bus structure with the second width.

19. The apparatus of claim 13, wherein the first group of memory cells comprises a memory array of a monolithic three-dimensional semiconductor memory device in which the memory cells are arranged in multiple physical levels above a silicon substrate and comprise a charge storage medium.

* * * * *